(12) United States Patent
Anderson et al.

(10) Patent No.: US 8,677,172 B2
(45) Date of Patent: Mar. 18, 2014

(54) METHOD AND SYSTEM FOR CORRECTING ERROR IN A PLL GENERATED CLOCK SIGNAL USING A SYSTEM CLOCK OF LOWER FREQUENCY AND/OR ACCURACY

(75) Inventors: Peter Anderson, Rugby (GB);
Jacqueline Bickerstaff, Daventry (GB);
Xianri Huang, Rugby (GB)

(73) Assignee: ST-Ericsson SA, Plan-les-Ouates ( * ) Notice: Subject to any disclaimer, the term of this patent is extended or adjusted under 35 U.S.C. 154(b) by 690 days.

(21) Appl. No.: 12/989,543

(22) PCT Filed: Apr. 21, 2009

(86) PCT No.: PCT/GB2009/001027
§ 371 (c)(1),
(2), (4) Date: Dec. 6, 2010

(87) PCT Pub. No.: WO2009/130460
PCT Pub. Date: Oct. 29, 2009

(65) Prior Publication Data
US 2011/0068828 A1 Mar. 24, 2011

(30) Foreign Application Priority Data
Apr. 25, 2008 (GB) .................................. 0807625.9

(51) Int. Cl.
*G06F 1/04* (2006.01)
*G06F 11/00* (2006.01)

(52) U.S. Cl.
USPC .............................. 713/500; 714/703; 714/704

(58) Field of Classification Search
USPC .......................... 713/500, 600; 714/703, 704
See application file for complete search history.

(56) References Cited

U.S. PATENT DOCUMENTS

| | | | |
|---|---|---|---|
| 4,929,890 A | 5/1990 | Bell et al. | |
| 5,153,599 A * | 10/1992 | Harigae et al. | 342/352 |
| 5,479,118 A | 12/1995 | Niijima | |
| 5,481,563 A * | 1/1996 | Hamre | 375/226 |
| 5,915,108 A * | 6/1999 | Frey et al. | 713/500 |
| 6,442,704 B1 | 8/2002 | Morimoto et al. | |
| 2001/0007136 A1* | 7/2001 | Tamura et al. | 713/500 |
| 2002/0106014 A1 | 8/2002 | Frisch | |
| 2005/0286670 A1 | 12/2005 | Jungerman | |
| 2006/0087352 A1 | 4/2006 | Byun et al. | |
| 2006/0268971 A1 | 11/2006 | Watabe | |

FOREIGN PATENT DOCUMENTS

| | | |
|---|---|---|
| EP | 1172960 A | 1/2002 |
| JP | 02040573 A | 2/1990 |

* cited by examiner

*Primary Examiner* — Chun Cao
(74) *Attorney, Agent, or Firm* — Coats & Bennett, P.L.L.C.

(57) ABSTRACT

The present invention provides a system for detecting timing characteristics of internal signals in a communications device, the system comprising: a system clock running at a known frequency; a test counter having a test input at which an internal signal to be tested is received; a gating counter having an input arranged to receive the system clock signal; and a system controller for controlling the counters; wherein the system controller controls the gating counter to count a predetermined number of system clock cycles to define a test period, and during the test period the test counter counts the cycles of the internal signal under test, whereby timing characteristics of the internal signal may be found with reference to a time base defined by the system clock. An associated method of operation is also described.

20 Claims, 6 Drawing Sheets

METHOD AND SYSTEM FOR CORRECTING ERROR IN A PLL GENERATED CLOCK SIGNAL USING A SYSTEM CLOCK OF LOWER FREQUENCY AND/OR ACCURACY

TECHNICAL FIELD

The present invention relates to the monitoring of timing characteristics of signals used in a digital communications system. More particularly, from one aspect the present invention relates to a method and system for detecting errors in a clock in a communications system, and in another aspect the invention relates to a method and system for finding offsets to be applied to a clock in a communications system.

BACKGROUND TO THE PRESENT INVENTION

Typical modern digital communications systems make use of many clocks, in order to operate the system elements. Typical such communications systems include mobile telephones, GPS receivers, and the like. Having accurate internal clocks is important, for example for signal acquisition, demodulation, and decoding purposes.

Figure 1:
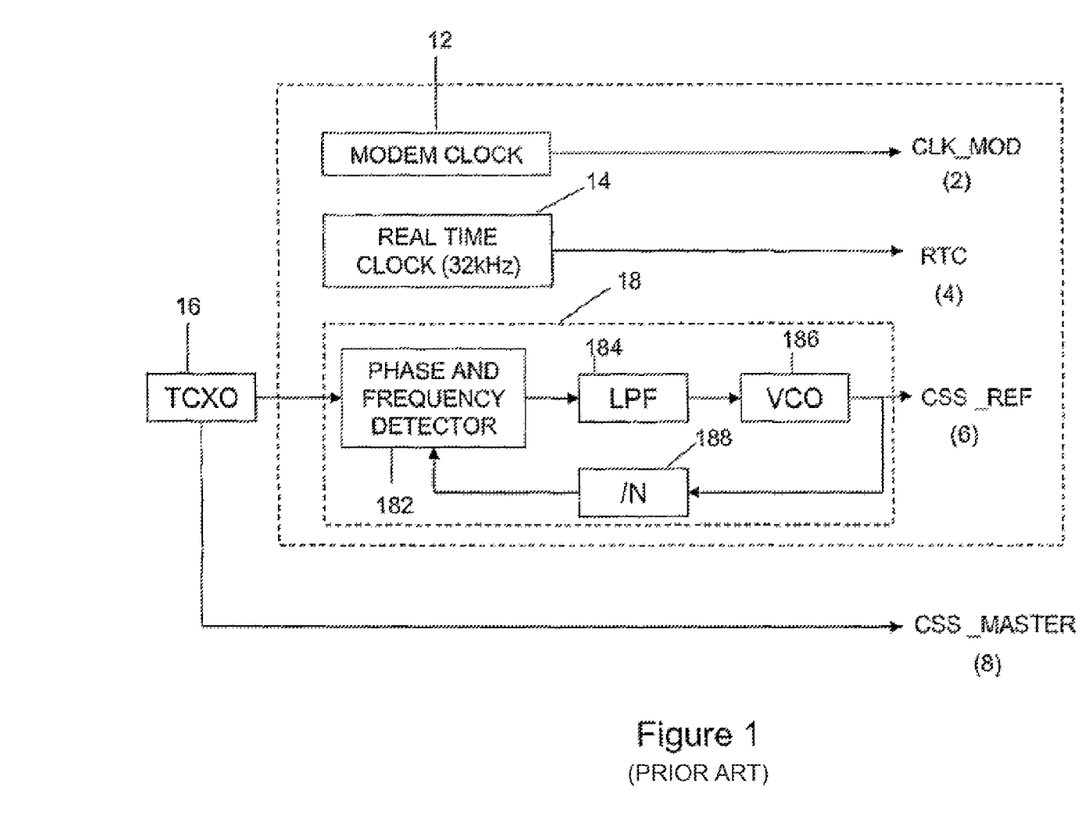
FIG. 1 is a block diagram of various clocks which may be present or generated in a communications device.

FIG. 1 illustrates the clocks present in a typical communications system. Firstly, a reference clock 12 from the communications modem, such as a cellular modem in the case of a cellular handset, may be provided, and which outputs a clock signal, CLK_MOD (2). This is a clock which may typically be switched on or off depending on the use of the communications system, in order to save power.

Additionally provided is typically a basic system clock, referred to as a real time clock 14. This provides a clock signal RTC (4). Typically, the frequency of such a clock is set to be 32 kHz, although other frequencies may be used.

Additionally, a communications system will usually have a very accurate master clock, typically located off chip, as shown by being located outside the outer dotted line in FIG. 1. The master clock will typically be a crystal oscillator (XO), or a temperature controlled crystal oscillator (TCXO) such as TCXO 16. Again, to save power the TCXO or XO may be switched off, when the communications system is not in use.

To generate a high frequency reference clock, needed, for example, for spread spectrum communications, a phase lock loop 18 is commonly used to generate the high frequency clock from the external oscillator 16. A phase lock loop typically comprises a phase and frequency detector (PFD) 182, which outputs a phase error signal to a low pass filter 184, the filtered phase error signal then being used to control a voltage controlled oscillator (VCO) 186. The output of the voltage controlled oscillator is taken as the high frequency clock signal, in this case CSS_REF (6), and is also fed back, typically via a frequency divider 188, to a second input of the phase and frequency detector 182. The first input of the phase and frequency detector 182 receives the reference clock from the external oscillator. The phase error signal output by the PFD 182 is dependent on the phase (and, initially, frequency) difference between the reference clock from the external oscillator and the frequency divided feed back clock. The phase lock loop acts to generate a higher frequency clock, based upon the reference clock input thereto. The operation of such a phase lock loop is well known in the art, and will not be described further.

Typically, the real time clock 14, which forms the basic system clock, will usually comprise a low precision oscillator, with an accuracy of typically between 20 to 100 parts per million (ppm). The other clocks in the system will typically have a much higher precision, between 0.05 to 2 parts per million, for example. The advantage of the real time clock, however, is that it is always switched on, whilst the communications system is powered up. That is, the operation of the clock is not dependent upon whether the communications system is actually operating i.e. to transmit or receive signals, like the other clocks. The real time clock signal is therefore always available to the communications system.

As mentioned, phase lock loops are often used to generate high frequency clocks based on the accurate external oscillator. However, phase lock loops can be very susceptible to a frequency deviation caused by an external interfering signal in a similar frequency band. For example, in the case where a strong interfering signal is present at a similar frequency to the clock output by the PLL, then that interfering signal can enter the feedback path of the PLL, causing the phase error signal generated by the phase and frequency detector 182 to become incorrect. In effect the interferer signal can capture the PLL, thus affecting the generation of the wanted clock, such as, in the example of FIG. 1, the communication subsystem reference clock CSS_REF. In many communications systems, if the high frequency clock within the system changes, then the overall time base used by the communications system will not be valid, and the communications system will fail. For example, in a GPS system, a GPS receiver would not be able to maintain track on satellites, and a position fix would not be able to be performed.

Heretofore it has been very difficult to actually detect within a communications system as to whether the generation of a clock signal is being affected by interference, such that the generated clock is no longer accurate. In this respect, the generated clocks are themselves typically the reference time bases for the other system components. It is known to be able to check the accuracy of clock signals using other, more accurate or higher frequency clocks. For examples, U.S. Pat. No. 6,442,704 and US 2005/0286670 give examples of such arrangements. However, these arrangements depend on the existence of high accuracy clock signals that themselves may be, unknowingly, suffering from either the same or different interference. As mentioned previously, the accurate generation of clock signals in a communications system is absolutely essential, and in particular for signal acquisition, demodulation, and decoding purposes. The ability to be able to check the accurate generation of clock signals in a reliable manner is therefore important.

SUMMARY OF THE INVENTION

In view of the above, from a first aspect an embodiment of the present invention provides a method and system to enable the detection of errors in generated clock signals, such that remedial action may be taken to try and correct the error. More particularly, in the embodiment according to the first aspect the number of clock cycles of a generated clock signal is counted with reference to a known and set number of clock cycles of the basic system clock, in the form of the real time clock. Because the real time clock is at a relatively low frequency compared to the generated clock signal, and moreover is immune from interference that would affect the generated clock signal, it can be used to provide a time base to measure the number of clock cycles of a generated clock, and to compare the count of clock cycles with an expected count, (or range of expected counts) to determine if the generated clock is in fact in error. If it is determined that the generated clock is in error, then remedial action may be taken. For example, in the case of a PLL generated clock, the PLL may be instructed to re-lock, to reset the clock.

From another aspect an embodiment of the present invention also provides for an offset correction signal to be found for a generated clock, based on a known offset correction signal used on another generated clock. In this respect whilst the generated clock may have a nominal frequency which is known in advance, in reality it is unlikely that the generated clock is exactly at that frequency. To correct such errors, commonly offsets can be applied to a generated clock signal, in order to make the generated clock signal equal to the nominal frequency it is meant to be at. However, without first knowing that a clock signal has an error with reference to a reference clock, it is not possible to determine the offset. In the embodiment of the second aspect of the invention, the offset applied to a first clock, and which is known from an external reference source, can be applied to an internally generated second clock signal in order to make the internally generated second clock signal more accurate. Again, this is performed by comparing relative clock counts of the first and second clock signals to a common time base, preferably defined by the real time clock. Moreover, the common time base is preferably immune from interference.

In view of the above, from one aspect the present invention provides a system for detecting timing characteristics of internal signals in a communications device, the system comprising: a system clock running at a known frequency; a test counter having a test input at which an internal signal to be tested is received; a gating counter having an input arranged to receive the system clock signal; and a system controller for controlling the counters; wherein the system controller controls the gating counter to count a predetermined number of system clock cycles to define a test period, and during the test period the test counter counts the cycles of the internal signal under test, whereby timing characteristics of the internal signal may be found with reference to a time base defined by the system clock.

Thus, using the system of the first aspect the system clock can be used as a reference time base against which timing characteristics of the other internal signals can be tested. Usually the other internal signals may be clock signals themselves, which are themselves being used as time bases for other operations, and hence being able to check whether they are themselves accurate (to the accuracy expected) is useful. In particular it can be used to identify whether a clock is itself suffering interference, or other problems in its generation.

In an embodiment the system clock signal that provides the time base is preferably immune from interference, and particularly at least from interference that would affect the internal signal under test. With such an arrangement, if the internal signal under test is being interfered with, then such interference will not affect the system clock signal, such that the interference can then be detected.

Moreover, in an embodiment the system clock signal is preferably of lower accuracy than the internal signal under test. The system clock signal may also preferably be of lower frequency than the internal signal under test. The advantage of using such a system clock signal is that it may be of simpler design and hence cheaper and/or more reliable components may be used for the system clock signal. In this respect, the system clock signal is used in the embodiments merely to detect timing characteristics of the internal signal, and particularly in one embodiment errors in the signal, and is not necessarily used for the generation of the internal signal itself.

Moreover, the system clock signal is preferably generated using a low power clock source, such that the system clock may be operated for as long as possible, whilst the communications system is in use. Thus, the system clock will be available almost all the time for tests of other internal signals to be made against. The real-time clock that is typically available in a communications system usually satisfies all these criteria i.e. is of low frequency (and hence generally immune from all interference), is of reliable and cheap design, and low accuracy. Moreover, it is also typically low power and hence generally available all the time.

In a particularly preferred embodiment the internal signal that is being tested is generated using a phase lock loop.

In a preferred embodiment the system controller is further arranged to compare the count on the test counter at the end of the test period with a predetermined nominal value or range of values expected for the count to determine an error in the timing characteristics of the internal signal under test. Where the internal signal is a clock with a nominal frequency and accuracy then if the clock is functioning correctly the count obtained during the known test period should be predictable. If the clock cycle count obtained after the test period is not within the predicted range of values, then the clock is suffering an error in its generation, possibly through interference.

Preferably, in the event of an error in the timing characteristics being detected, remedial action is taken in the generation of the internal signal to correct said error. The remedial action to be taken will depend on how the internal signal is generated. For example, where the internal signal is generated using a phase lock loop, the phase lock loop is caused to reacquire its lock.

In another preferred embodiment a first internal signal having a known timing offset is tested by the system against the time base defined by the system clock to obtain a first count, and a second internal signal having an unknown timing offset is also tested by the system against the same time base to obtain a second count, the system controller being further arranged to calculate the unknown timing offset in dependence on the first and second counts and the known offset. Such operation allows the timing offset from a first timing signal to be transferred to a second timing signal, even though the two timing signals are generated separately and are otherwise unrelated. This is because it is possible to relate the timings of the two signals together through the common time base provided by the system clock.

In the second preferred embodiment the system controller calculates the unknown timing offset using the following equation:

$$\frac{A}{B} = \frac{X + dX}{Y + dY}$$

wherein A is the first count, B is the second count, X is a nominal frequency of the first internal signal, dX is the known timing offset of the first internal signal, Y is a nominal frequency of the second internal signal, and dY is the unknown timing offset of the second internal signal. Preferably, once found the calculated timing offset is then used in the generation of the second internal signal. This will allow the second internal signal to be generated closer to or at its intended nominal value.

In the preferred embodiments the internal signals are preferably clock signals. Clock signals are themselves used as time bases for other system operations, such as signal acquisition, demodulation, and decoding, and hence accurate clock signals are essential for the operation of a communications device. More preferably, the clock signals are clock signals of a higher frequency and/or accuracy than the system clock against which they are measured.

Preferably, the communications device is a satellite positioning system (SPS) receiver, such as a Global Positioning System (GPS) or Galileo receiver. Even more preferably the SPS receiver is combined with a cellular mobile communications transceiver.

From another aspect the present invention also provides a method for detecting timing characteristics of internal signals in a communications device, comprising the steps: generating a system clock signal running at a known frequency; counting a predetermined number of system clock cycles to define a test period; and during the test period, counting the cycles of an internal signal under test; a test counter having a test input at which an internal signal to be tested is received; wherein timing characteristics of the internal signal may be found with reference to a time base defined by the system clock.

The same advantages are obtained in respect of the second aspect as in respect of the first aspect, and the same further features and advantages may also be obtained.

BRIEF DESCRIPTION OF THE DRAWINGS

Further features and advantages of the present invention will become apparent from the following description of embodiments thereof, presented by way of example only, and by reference to the accompanying drawings, wherein like reference numerals refer to like parts, and wherein.

EMBODIMENTS OF THE INVENTION

Several embodiments of the present invention will now be described, with respect to the drawings.

Figure 2:
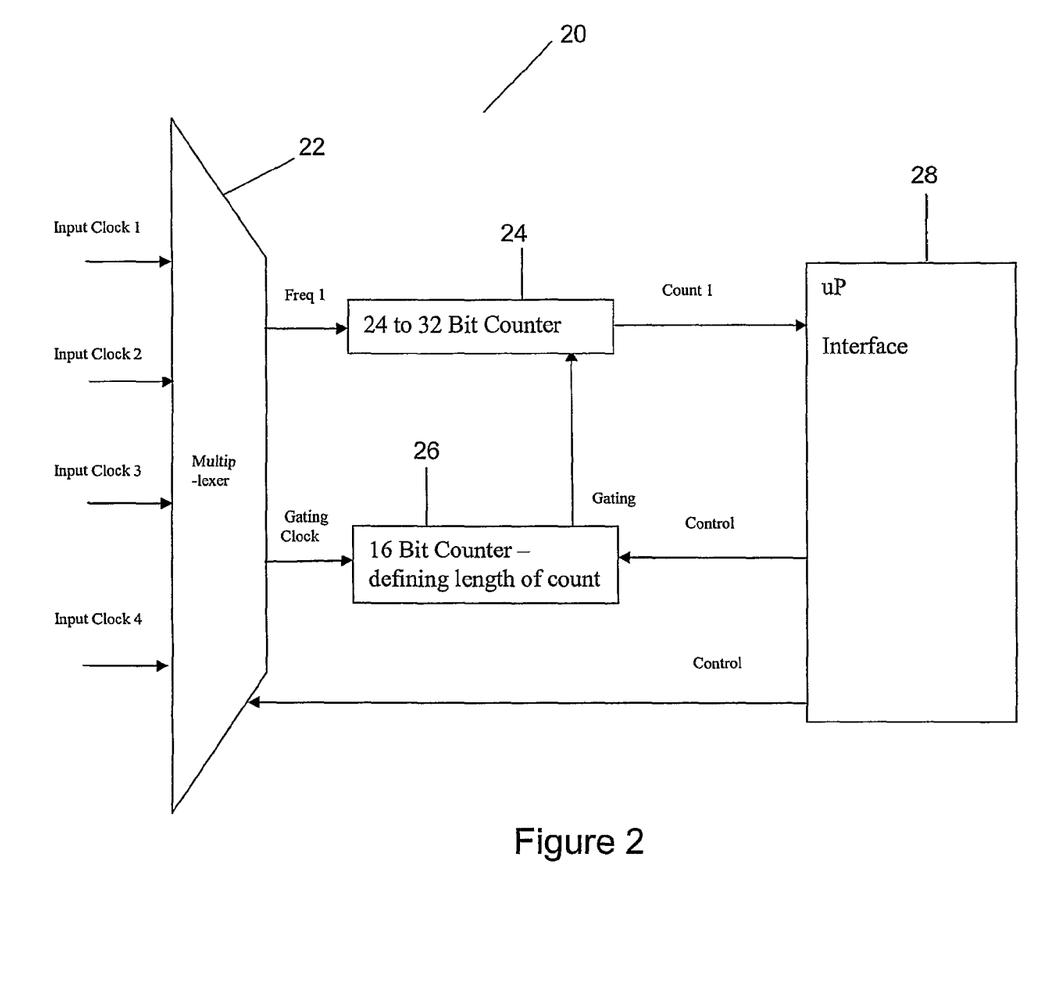
FIG. 2 is a block diagram of the elements of a first embodiment of the present invention.

FIG. 2 is a block diagram of the hardware elements used in a first embodiment of the present invention. More particularly, the first embodiment of the present invention is intended to detect errors within generated clock signals, by comparing a generated clock signal with a basic system clock, that is typically of a lower accuracy, and/or frequency than the generated clock. For optimal operation the basic system clock that is used should preferably be immune from interference that would affect the generated clock. Preferably the real time clock, which is typically, although not exclusively, set at 32 KHz, is used for this purpose, although other clock signals may be used, provided they are immune from interference that would affect the internal signal under test.

In addition, the clock that is used as the basic system clock need not be of high accuracy, and preferably is of lower accuracy than the clock or other internal signal under test. In this respect, the system clock is not being used to generate the signal under test, but merely to detect errors in the signal. Therefore, the basic system clock need only be as accurate as is necessary to detect errors. Conversely, for a system clock of a given accuracy e.g. 20 to 100 ppm for a typical cheap crystal oscillator, then errors in the internal signal under test will be detected once they are larger than the accuracy of the system clock. Using a relatively low accuracy clock means that cheaper components may be used.

In particular, in the first embodiment of the present invention the number of clock cycles of the generated clock signal under test are compared during a time period defined by a particular number of clock cycles of the real time clock. Given that the real time clock is not usually subject to interference, by counting the number of clock cycles during the time period set by the real time clock of the clock under test, and comparing the resulting count with an expected value for the nominal frequency of the clock, an indication as to whether the generated clock under test is suffering interference can be obtained. If it is determined that the generated clock is suffering interference, then remedial action, such as the resetting of a PLL which generates the clock, can be undertaken. A further advantage of using the real-time clock is that it has few failure modes, and extremely low power requirements, such that it can be available under almost all conditions.

The clock error detection apparatus of the first embodiment therefore comprises clock error detection apparatus 20, having an input multiplexer 22. The input multiplexer 22 receives as inputs thereto the various clock signals in the system, such as, for example, the clock signals 2 to 8, described previously with respect to FIG. 1. In particular, it is important that one of the input clock signals is the real time clock 4, which is used as a reference clock. Additionally provided is a first test counter 24, which is preferably a 24 to 32 bit counter, and which is arranged to receive the clock signal of the clock which is under test, and to count the number of clock cycles during the test period. The counter 24 receives a gating control signal from a second counter 26. The gating control signal controls whether the counter 24 continues to count the clock cycles, or not. The counter also has a reset input, which is not shown.

The second counter 26, referred to hereafter as the gating counter, receives a gating clock signal. As mentioned, typically the multiplexer switches the real time clock signal to the gating counter 26 as the gating clock signal. The counter is arranged to count the number of clock cycles of the gating clock signal which it receives from the multiplexer. The gating counter 26 also receives a control signal from a microprocessor 28, in order to be able to reset the counter, and to indicate to the counter when it is to start. The gating counter 26 outputs the gating control signal to the test counter 24, as described.

As also mentioned, further provided is a microprocessor 28, which receives an input from the test counter 24, so as to indicate the present count on the count when the counter is gated, and a test has been completed. The microprocessor 28 also controls the gating counter 26, as described. It further controls the multiplexer 22, via a control line, so as to instruct the multiplexer 22 as to which input clock signals to switch to either the test counter, or the gating counter. As mentioned, typically the gating counter will receive the RTC clock, which is used as a time base for testing the other clocks. However, another clock may also be used as the gating clock, provided the accuracy of the clock which is used as the gating clock and its immunity from interference can be relatively assured. The relatively low frequency and operation of the RTC clock provided these advantages. The microprocessor 28 will operate in accordance with a control program (not shown) in order to control the counter 24 and 26, and the multiplexer 28. The operation of the clock testing apparatus 20 under the control of the microprocessor 28 will be described next, with respect to FIG. 3.

Figure 3:
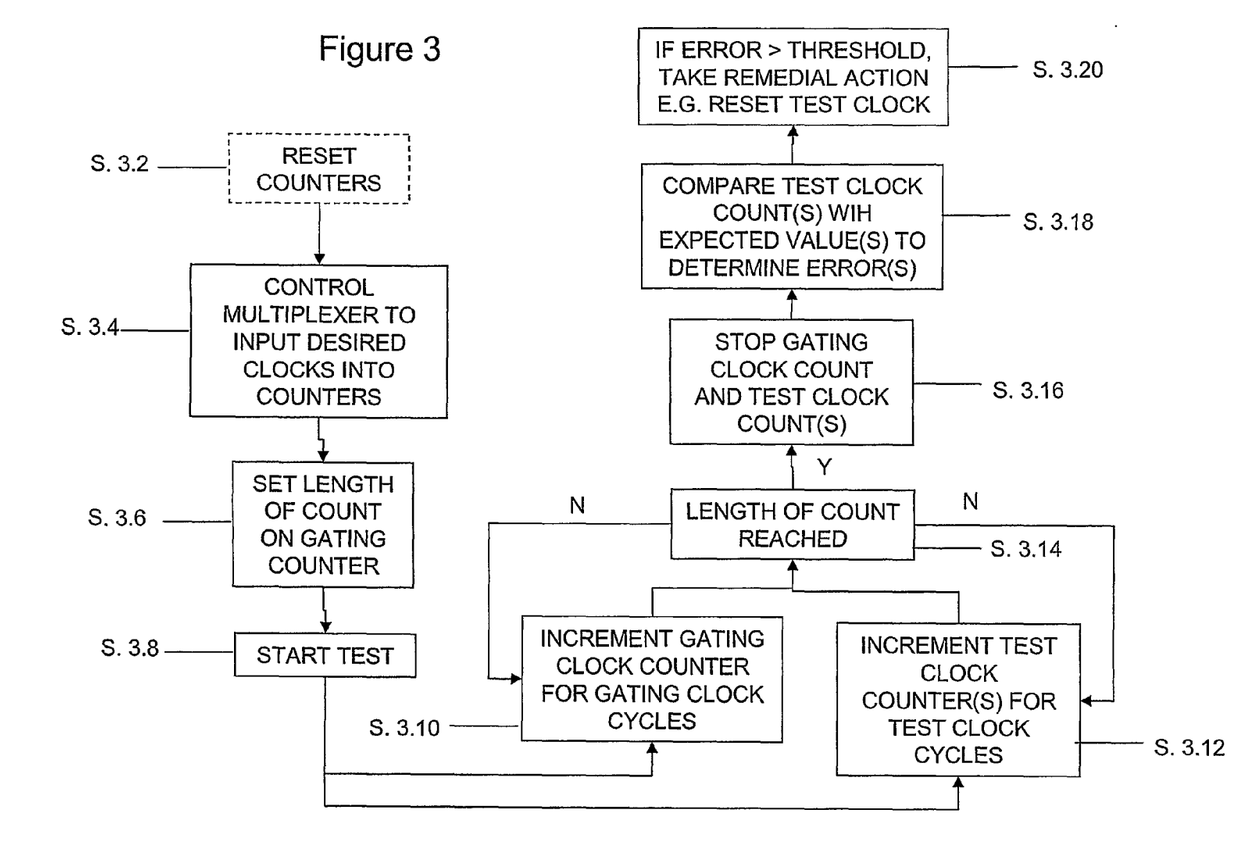
FIG. 3 is a flow diagram of the operation of the first embodiment of the present invention.

Reviewing FIG. 3, first the microprocessor 28, at step 3.2, controls the test counter 24 and the gating counter 26 so as to reset the counts on the counters, if the counters have not already been initialised. Next, at step 3.4, it controls the multiplexer 22 to switch the desired clocks into the test counter 24, and the dating counter 26. As mentioned, the multiplexer 22 is controlled so as to switch preferably the RTC clock into the gating counter 26, to form a time base for the test. Any of the other generated clocks may be switched into the test counter 24, so as to be tested. In particular, however, it is those clocks which are generated using PLLs which are susceptible to interference, and hence typically it is the PLL generated clocks which will be tested. For example, in the present embodiment, the communications subsystem reference clock CSS_REF generated by PLL 18 would typically be tested.

Once the multiplexer has switched the desired clocks into the test and the gating counter, next, the microprocessor 28 controls the gating counter so as to set the length of the count on the gating counter. The operation of the gating counter 26 is such that it will count up to the count which is set at step 3.6, and thereafter stop counting, and issue a gating signal to the test counter 24, to stop the test counter counting. The length of count for the real time clock may be anything from 1000 to 32768 clock cycles of the RTC clock i.e. anything from 0.03 to approximately 1 second.

After steps 3.2 to 3.6, which are initialisation steps prior to the test, the test can then be commenced, at step 3.8.

During the test, the clock signal under test is fed to the test counter 24, which increments the test counter for each test clock cycle, as shown at step 3.2. In parallel, the gating clock signal, preferably the RTC, is passed to the gating counter 26, which increments its counter for each gating clock cycle, as shown at step 3.10. The gating clock counter repeatedly compares the gating clock count to the preset length of count, to see if the length of count has been reached. While the length of count has not been reached, then the test counter and the gating counter continue to increment, based on their respective clock cycles.

Once the length of count has been reached, as determined by the evaluation at step 3.14, then, as shown at step 3.16, the gating clock count and the test clock count are stopped. At that point, the microprocessor 28 reads off the count from the test clock count and, at step 3.18, compares the test clock count with an expected value for the clock, during the test period as measured by the real time clock.

As mentioned, the length of count for the real time clock may be anything from 1000 to 32768 clock cycles of the RTC clock i.e. anything from 0.03 to approximately 1 second for a 32 kHz clock. Knowing the precision of the RTC clock, as well as the expected precision of the clock under test (which will typically be much higher than the RTC clock), then a range of expected values for the test count can be found in advance, against which the actual test count can be compared. The range of expected values are typically stored in the microprocessor 28 (although may be stored elsewhere and loaded as necessary), and the test clock count can be compared with the expected values to determine a test clock error, at step 3.18. If this error is sufficiently large, such as, for example over a threshold value, or alternatively, if the test clock count is simply not in the expected range of values, then the conclusion can be drawn that the clock under test is suffering interference, and that remedial action should be taken, as shown at step 3.20. Typical remedial action which will be taken, in the case of a PLL generated clock, would be to instruct the PLL to reset, and relock. In this case, in the case of a mobile system, or a mobile interferer, it is possible that the system will no longer be subject to the interference, or that the interference is reduced, and hence relocking the PLL should remedy the problem.

The accuracy of the technique is that it is able to detect any changes in clock frequency of more than the accuracy of the real time clock i.e. typically 32 KHz (e.g. 0.01% for a hundred PPM part). Any of the clocks present in the system can be monitored by multiplexing them to the input of the test counter. Additionally, in further embodiments it is possible that multiple clocks at once may be tested in this way, for example by providing further test counters, such as shown in apparatus 30, in FIG. 5. Here, two test counters 34 and 36 are provided, each of which are controlled by the gating counter 38. By providing further test counters 24, then plural clocks can be tested at once, in parallel.

Figure 4:
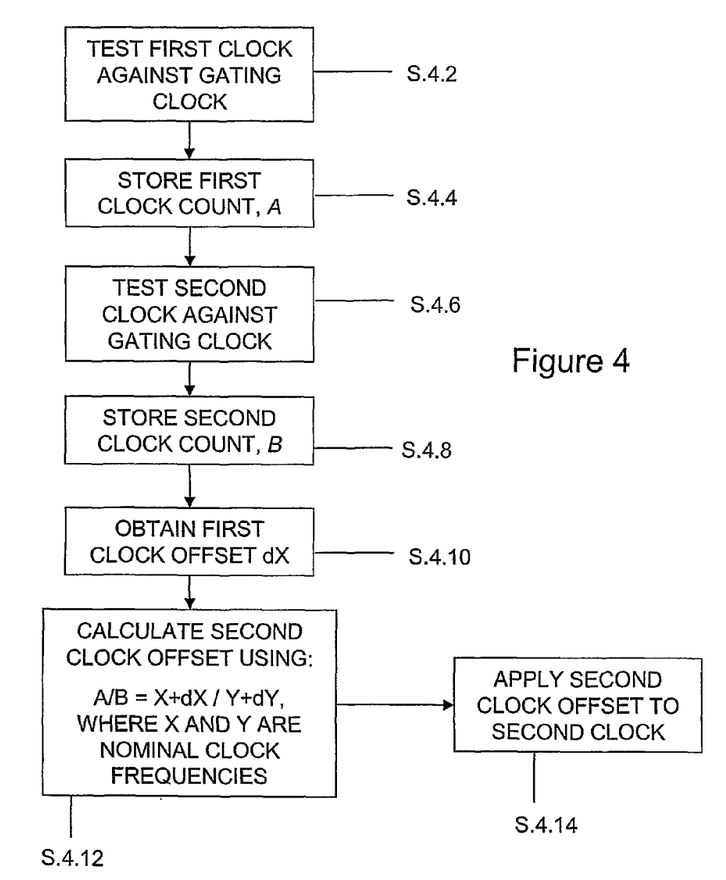
FIG. 4 is a flow diagram of the operation of a second embodiment of the present invention.

A second embodiment of the present invention will now be described with respect to FIG. 4. The second embodiment of the invention corresponds to the second aspect mentioned previously, and in particular acts to determine an offset to be applied to a generated clock, from an offset which is already known for another clock generated in the system. To determine the offset of a generated clock from an already known offset, the same test apparatus 20 can be used as described previously with respect to FIG. 2. Repeat description thereof will not therefore be undertaken. However, the microprocessor 28, whilst performing some of the same steps as described previously with respect to FIG. 3, also in addition provides for a different calculation to be performed on the result, in order to determine the unknown offset. FIG. 4 illustrates the steps performed by the microprocessor 28, according to the second embodiment.

With reference to FIG. 4 within the second embodiment two test clocks are each counted one after the other against the same number of cycles of a reference clock, such as the RTC clock. By counting the two test clocks against this same time base, and comparing the respective counts thus obtained, where the correction offset for one of the clocks is known, then the correction offset, which is presently unknown, for the other of the clocks can also be found. This is because the two clocks have been measured against exactly the same time base i.e. the gating clock, which is typically the RTC clock.

More particularly, imagine a first generated clock has a nominal frequency of X Hz, and a second generated clock has a nominal frequency of Y Hz. The nominal frequencies are the intended design frequencies of the clocks, to obtain the intended system operation. However, in practice the frequencies of the clocks which are actually generated will not be exactly at the nominal values; they will typically be offset by particular values $dX$ and $dY$, representing the error between the actually generated clock frequencies, and the nominal frequencies. Therefore, the actual frequency of the first generated clock is:

Actual frequency of first clock=$X+dX$ Hz and the actual frequency of the second generated clock is:

Actual frequency of second clock=$Y+dY$ Hz.

In many communications systems, for example a cellular communications subsystem, the offset of one of the clocks of the communication subsystem is provided to the communications system from an external source, which compares the generated clock signal (as represented by a transmitted signal) with a reference signal. For example, in a mobile telecommunications network, a very accurate oven controlled crystal oscillator reference clock may be present in a base station, or a base station controller, against which an error offset measure can be found for a received signal from a mobile handset. This clock error offset value is then communicated to the handset, and can be used by the handset to correct the internally generated clock. Thus, where the offset is already known for a first internally generated clock, this can be used to find the offset to be applied for a second internally generated clock, using the technique described below.

More particularly, because the two internally generated clocks may be tested with respect to the same time base, e.g. that of the real time clock, and over the same number of clock cycles of the real time clock, then it is possible to compare the ratio of the respective counts of the first and second internally generated clocks with the ratio of the nominal frequency of the first clock plus the known offset and the nominal frequency of the second clock plus the unknown offset. That is:—

$$\frac{A}{B} = \frac{X + dX}{Y + dY}$$

wherein A is the number of clock cycles of the first generated clock during Z clock cycles of the real time clock, and B is the number of clock cycles of the second generated clock during Z clock cycles of the real time clock.

Using the above, and finding A and B, and knowing X, and dX, then (Y+dY) and dY can be calculated. In addition, for example, in the case of a mobile handset which makes use of cellular communications and also has a GPS receiver, if X is the cellular clock, and Y is the GPS clock, then Y can also be obtained.

FIG. 4 illustrates the steps performed by the microprocessor 28 in performing the above procedure. First of all, at step 4.2, the first clock for which the offset is known is tested against the gating clock. In this respect, the step of testing a clock against the gating clock includes each of steps 3.2 to 3.16, described previously. After step 4.2 a first clock count, A, is read off the test counter 24, and stored in the microprocessor, at step 4.4. Next, the second clock, for which the offset is to be found, is tested against the gating clock at step 4.6. Here, it is important that the second clock is tested against the same number of gating clock cycles as the first clock signal. Again, the testing process includes steps 3.2 to 3.16, as previously described. After the second clock signal has been tested against the gating clock, the second count on the test counter 24, B, is read, and stored within the microprocessor 28, at step 4.8.

The offset, dX, for the first clock is obtained at step 4.10. For example, as described previously, the offset may be obtained from an external reference source. In the case of a cellular handset, the external reference source may, for example, be the cellular base station. Then, knowing the first clock count, A, and the second clock count, B, as well as the first clock offset dX, and the nominal clock frequencies X and Y, it becomes possible to calculate Y+dY, and subsequently the second clock offset dY, as shown at step 4.12. At step 4.14, the second clock offset can then be applied to the second clock. This will then cause the second clock to run more accurately, at the nominal frequency Y.

With the above, therefore, the known offset from one generated clock signal can be used to generate an unknown offset for a different, unrelated clock signal. Therefore, the second clock signal for which the offset is unknown can be rendered more accurate.

Figure 5:
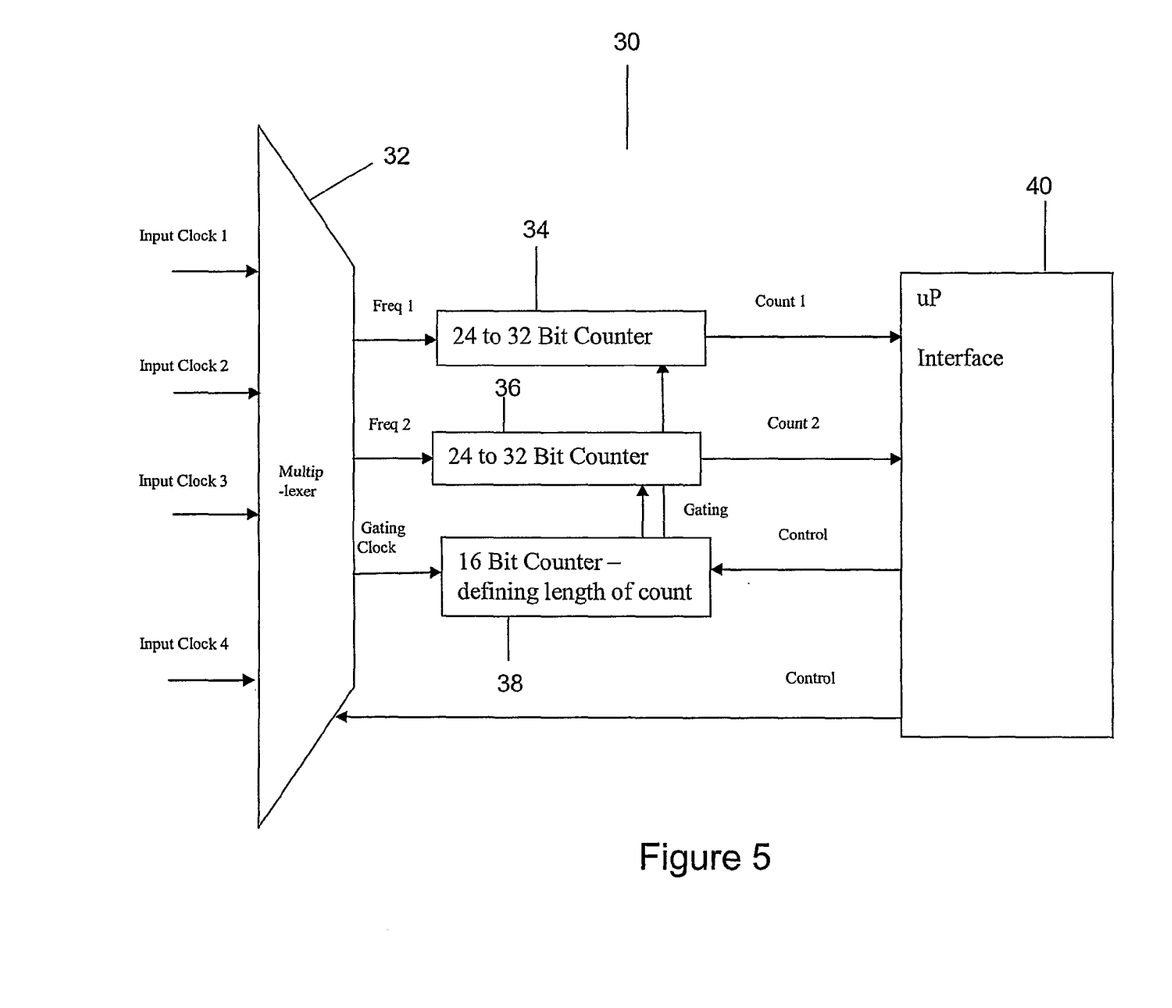
FIG. 5 is a block diagram of a third embodiment of the present invention.
Figure 6:
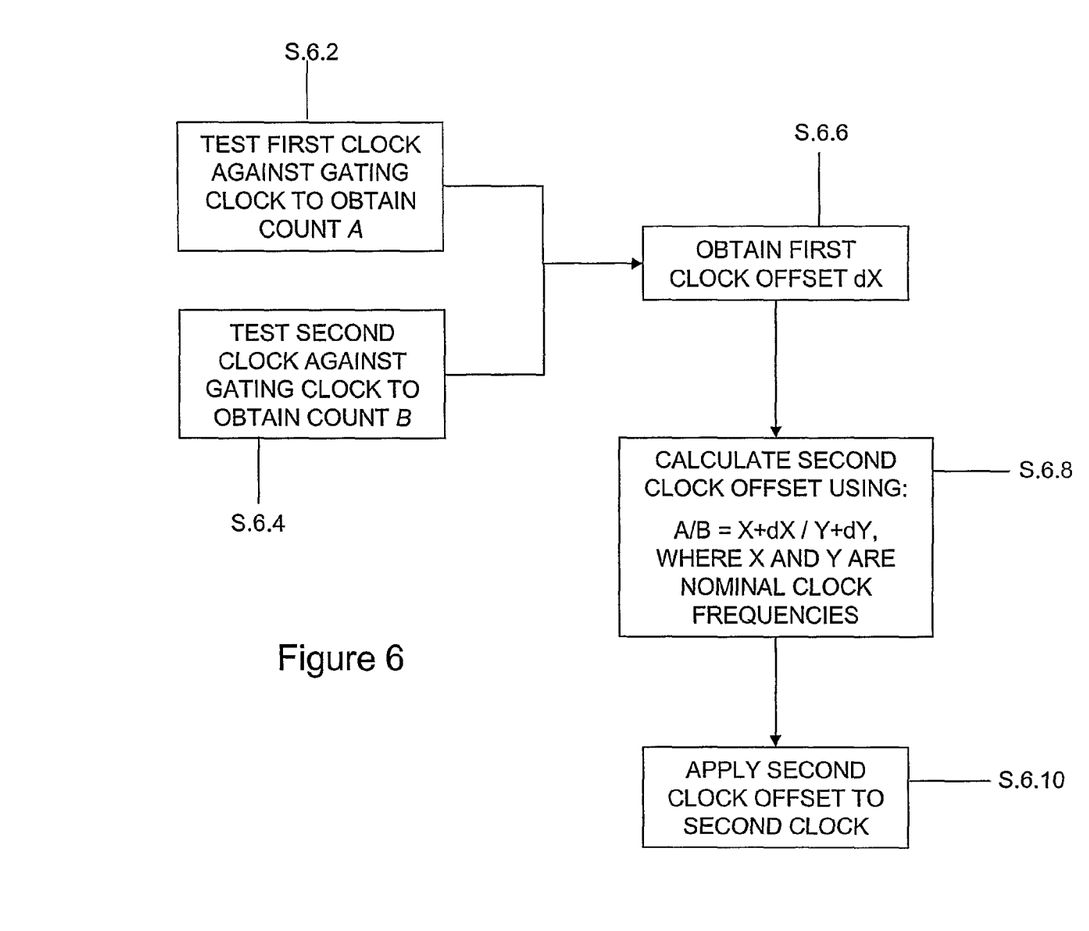
FIG. 6 is a flow diagram of a method according to the third embodiment of the present invention.

It should be noted that in the second embodiment the testing of the first and second signals is performed in series. However, in a third embodiment, which makes use of the apparatus of FIG. 5 having two test counters 34 and 36, it is possible to perform the same procedure, but to test the first and the second clock against the gating clock in parallel. The procedure for so doing is shown in FIG. 6.

Here, in the third embodiment the first clock is tested against the gating clock to obtain count A on the first test counter 34, at step 6.2. At the same time, the second clock signal is tested against the gating clock to obtain the count B, at step 6.4. These counts are then available on the counters 34 and 36, and can be used directly by the microprocessor 40, to obtain the second clock offset, apply steps 6.6, 6.8, and set step 6.10, which are identical to steps 4.10 to 4.14, described previously. Thus, in the third embodiment it becomes possible to obtain the offset for the second clock signal much more quickly than in the second embodiment, but requiring the extra test counter 36.

It should be noted that in the above described second and third embodiments the clock that provides the common timebase against which the measurements are taken need not be a particularly accurate clock, and may be of less accuracy than the actual signals or clocks being measured. The important issue is simply that the two signals are measured against the same timebase, i.e. for the same amount of time, however long that time may be. The accuracy of the clock that measures the timebase is not that important. In this respect, the third embodiment provides an additional advantage over the second embodiment, in that the two measurements required are taken at the same time i.e. against the same timebase and during the same time interval, and hence any time variations in the accuracy of the timebase can be discounted. For the second embodiment, where measurements are made in different time intervals against the same timebase, the absolute accuracy of the timebase is unimportant provided the error in the timebase is the same for each measurement time interval.

With the embodiments of the invention, therefore, a low frequency and low accuracy system clock such as the real time clock is used as a check on the validity of other generated clocks in the communication system, which may be of higher frequency and higher accuracy. In particular, it can be used to detect whether there are errors in any of the generated clocks, such as caused by interference, and secondly it may also be used to transfer the frequency offset of a first clock to that of another clock. Thus, by comparing the two clocks with respect to the same time base defined by the reference clock, i.e. the real time clock then even though the first and second clocks are essentially unrelated, and generated separately, the offset required to render the second clock more accurate can be found, using the offset from the first clock.

Moreover, as will be apparent, the same hardware may be used to provide both functions. The difference between the embodiments to provide both the error detection function, and the offset calculation function is in the processing performed by the microprocessor on the respective comparisons of the clocks to the reference time base represented by the real time clock.

It should be noted that the technique of using the basic system clock such as the real time clock as a reference time base, and in particular counting the number of cycles of such a clock during an event, can be applied elsewhere. For example, it can also be used to measure an unknown frequency, such as the frequency of the temperature controlled crystal oscillator (TCXO). In this case, the TCXO signal is input as the test clock into the test counter 24, and the RTC clock input as the gating clock to gating counter 26. The gating counter is then run for a predetermined count, i.e. a predetermined number of clock cycles of the RTC clock, whilst the test counter counts the number of clock cycles of the TCXO. In view of the fact that the length of the count of the RTC clock acting as a reference time base corresponds to a known amount of time (within the accuracy of the RTC), the frequency of the TCXO can be determined by comparing the number of clock cycles thereof during that known amount of time.

In the above embodiments the embodiments have been described with reference to a hardware implementation to perform the tests, with the test results then being analysed by a microprocessor according to a particular control program. In other embodiments, however, the test may be performed as a further mixture of hardware and software, by counting the number of gating clock cycles occurring between two software interrupts generated a known number of cycles apart (e.g. multiples of 1 ms).

Further modifications and uses will be apparent to the person skilled in the art, to provide additional embodiments of the present invention, any and all of which are intended to be encompassed by the appended claims.

The invention claimed is:

1. A system for detecting timing characteristics of generated clock signals in a communications device, the system comprising:
a phase lock loop configured to generate a first clock signal to be tested;
a test counter having a test input at which the generated first clock signal to be tested is received;
a system clock running at a known frequency to produce a system clock signal, the system clock signal being of a lower accuracy than the generated first clock signal;
a gating counter having an input arranged to receive the system clock signal; and
a system controller operative to control the counters;
wherein the system controller is operative to control the gating counter to count a predetermined number of system clock cycles to define a test period, and during the test period the test counter is operative to count the cycles of the generated first clock signal under test, whereby timing characteristics of the generated first clock signal may be found with reference to a time base defined by the system clock so as to detect errors in the generated first clock signal;
wherein the system is configured so that, in response to an error being detected in the generated first clock signal, remedial action is taken to correct the error, the remedial action comprising causing the phase lock loop to re-acquire a lock.

2. The system of claim 1, wherein the system clock is immune from interference that would affect the generated first clock signal to be tested.

3. The system of claim 1, wherein the system clock is a real-time clock.

4. The system of claim 3, wherein the real-time clock comprises a low precision oscillator with an accuracy of between 20 to 100 parts per million.

5. The system of claim 1, wherein the system controller is further operative to compare the count on the test counter at the end of the test period with one of a predetermined nominal value or range of values expected for the count to determine an error in the timing characteristics of the generated first clock signal under test.

6. A method for detecting timing characteristics of generated clock signals in a communications device, comprising:
generating a first clock signal to be tested using a phase lock loop;
during a test period, counting cycles of the generated first clock signal using a test counter having a test input at which the generated first clock signal is received;
generating a system clock signal running at a known frequency, the system clock signal being of being of at least one of a lower accuracy than the generated first clock signal to be tested;
counting a predetermined number of system clock cycles to define a test period;
wherein timing characteristics of the generated first clock signal may be found with reference to a time base defined by the system clock so as to detect errors in the generated first clock signal;
in response to detecting an error in the generated first clock signal, taking remedial action in the generation of the first clock signal to correct the error, the remedial action comprising causing the phase lock loop to re-acquire a lock.

7. The method of claim 6, wherein the system clock is immune from interference that would affect the generated first clock signal to be tested.

8. The method of claim 6, wherein the system clock is a real-time clock.

9. The method of claim 8, wherein the real-time clock comprises a low precision oscillator with an accuracy of between 20 to 100 parts per million.

10. The method of claim 6, further comprising: comparing the count of cycles of the generated first clock signal under test at the end of the test period with one of a predetermined nominal value or range of values expected for the count to determine an error in the timing characteristics of the generated first clock signal under test.

11. A system for detecting timing characteristics of generated clock signals in a communications device, the system comprising:
a phase lock loop configured to generate a first clock signal to be tested;
a test counter having a test input at which the generated first clock signal to be tested is received;
a system clock running at a known frequency to produce a system clock signal, the system clock signal being of a lower frequency than the generated first clock signal;
a gating counter having an input arranged to receive the system clock signal; and
a system controller operative to control the counters;
wherein the system controller is operative to control the gating counter to count a predetermined number of system clock cycles to define a test period, and during the test period the test counter is operative to count the cycles of the generated first clock signal under test, whereby timing characteristics of the generated first clock signal may be found with reference to a time base defined by the system clock so as to detect errors in the generated first clock signal;
wherein the system is configured so that, in response to an error being detected in the generated first clock signal, remedial action is taken to correct the error, the remedial action comprising causing the phase lock loop to re-acquire a lock.

12. The system of claim 11, wherein the system clock is immune from interference that would affect the generated first clock signal to be tested.

13. The system of claim 11, wherein the system clock is a real-time clock.

14. The system of claim 13, wherein the real-time clock comprises a low precision oscillator with an accuracy of between 20 to 100 parts per million.

15. The system of claim 11, wherein the system controller is further operative to compare the count on the test counter at the end of the test period with one of a predetermined nominal value or range of values expected for the count to determine an error in the timing characteristics of the generated first clock signal under test.

16. A method for detecting timing characteristics of generated clock signals in a communications device, comprising:
generating a first clock signal to be tested using a phase lock loop;
during a test period, counting cycles of the generated first clock signal using a test counter having a test input at which the generated first clock signal is received;
generating a system clock signal running at a known frequency, the system clock signal being of being of a lower frequency than the generated first clock signal to be tested;
counting a predetermined number of system clock cycles to define a test period;
wherein timing characteristics of the generated first clock signal may be found with reference to a time base defined by the system clock so as to detect errors in the generated first clock signal;
in response to detecting an error in the generated first clock signal, taking remedial action in the generation of the first clock signal to correct the error, the remedial action comprising causing the phase lock loop to re-acquire a lock.

17. The method of claim 16, wherein the system clock is immune from interference that would affect the generated first clock signal to be tested.

18. The method of claim 16, wherein the system clock is a real-time clock.

19. The method of claim 18, wherein the real-time clock comprises a low precision oscillator with an accuracy of between 20 to 100 parts per million.

20. The method of claim 16, further comprising: comparing the count of cycles of the generated first clock signal under test at the end of the test period with one of a predetermined nominal value or range of values expected for the count to determine an error in the timing characteristics of the generated first clock signal under test.

* * * * *